United States Patent
Azuma et al.

(10) Patent No.: US 9,000,601 B2
(45) Date of Patent: Apr. 7, 2015

(54) POWER SEMICONDUCTOR MODULE

(75) Inventors: Katsunori Azuma, Hitachi (JP); Kentaro Yasuda, Hitachi (JP); Takahiro Fujita, Fussa (JP); Katsuaki Saito, Iwaki (JP); Yoshihiko Koike, Hitachinaka (JP); Michiaki Hiyoshi, Yokohama (JP)

(73) Assignee: Hitachi Power Semiconductor Device, Ltd., Ibaraki (JP)

( * ) Notice: Subject to any disclaimer, the term of this patent is extended or adjusted under 35 U.S.C. 154(b) by 114 days.

(21) Appl. No.: 13/533,273

(22) Filed: Jun. 26, 2012

(65) Prior Publication Data

US 2013/0001805 A1   Jan. 3, 2013

(30) Foreign Application Priority Data

Jun. 29, 2011   (JP) .................... 2011-143728

(51) Int. Cl.
  *H01L 23/522* (2006.01)
  *H01L 25/07* (2006.01)

(52) U.S. Cl.
  CPC ..... *H01L 25/072* (2013.01); *H01L 2224/48137* (2013.01); *H01L 2224/49111* (2013.01); *H01L 2224/49175* (2013.01); *H01L 2224/45124* (2013.01); *H01L 2224/45147* (2013.01); *H01L 2924/13055* (2013.01); *H01L 2924/30107* (2013.01)

(58) Field of Classification Search
  CPC .................. H05B 37/02; H01L 25/072; H01L 2924/13055; H01L 2924/30107
  USPC .......... 257/784, E23.104, E23.187, E23.142; 363/89, 80, 20, 16, 17, 53; 315/201; 323/285, 272
  See application file for complete search history.

(56) References Cited

U.S. PATENT DOCUMENTS

| 2002/0024135 A1 | 2/2002 | Arai et al. |
| 2007/0159864 A1* | 7/2007 | Yoshizaki et al. ............. 363/89 |
| 2010/0089607 A1 | 4/2010 | Nakamura et al. |

FOREIGN PATENT DOCUMENTS

| JP | 2001-185679 | 7/2001 |
| JP | 2002-141465 | 5/2002 |
| JP | 2002-153079 | 5/2002 |
| JP | 2002-153079 | 5/2004 |
| JP | 2005-101256 | 4/2005 |
| JP | 2009-278772 | 11/2009 |
| JP | 2010-088299 | 4/2010 |

OTHER PUBLICATIONS

Extended European Search Report in EP 12173902.3-2203 (5 pgs., in English).
Office Action in JP 2011-143728, mailed Sep. 24, 2013, (in Japanese, 3 pgs.); [English language translation, 2 pgs.].

* cited by examiner

*Primary Examiner* — Kenneth Parker
*Assistant Examiner* — Bo Fan
(74) *Attorney, Agent, or Firm* — Baker Botts L.L.P.

(57) ABSTRACT

The respective main electrodes of the semiconductor switching elements such as IGBTs, which are respectively mounted on the plurality of insulating boards, are electrically connected to each other via the conductor member. This configuration makes it possible to suppress the occurrence of the resonant voltage due to the junction capacity and the parasitic inductance of each semiconductor switching element.

4 Claims, 8 Drawing Sheets

PRESENT EMBODIMENT

POWER SEMICONDUCTOR MODULE

BACKGROUND OF THE INVENTION

The present invention relates to a power semiconductor module which is used for the power conversion and control.

A power conversion apparatus is equipped with a function of converting a DC power, which is supplied from a DC power-source, into an AC power. This AC power is then supplied to an AC electric load such as a rotating electric machine. Otherwise, the power conversion apparatus is equipped with a function of converting an AC power, which is generated by a generator, into a DC power. In order to accomplish the power conversion functions like these, the power conversion apparatus includes a power conversion circuit such as an inverter circuit. This power conversion circuit employs therein power semiconductor modules which are equipped with a current-switching function. Accordingly, by repeating the electric-conduction operation and the electric-interrupt operation, the power conversion apparatus performs the power conversion from the DC power to the AC power or from the AC power to the DC power.

Each power semiconductor module is fabricated as follows: Namely, an insulating board, on which a wiring pattern is formed, is bonded on a heatsink-use metallic base by using a method such as soldering. Moreover, a plurality of semiconductor elements are mounted on the wiring pattern on the insulating board in such a manner that the semiconductor elements establish an in-parallel connection to each other. On a large-power-use power semiconductor module, the plural number of insulating boards are mounted in order to perform the switching for the large current. This configuration allows implementation of the in-parallel connection of the large number of semiconductor elements.

As the conventional power semiconductor modules like these, there have been known the ones that are disclosed in JP-A-4138192, JP-A-4484400, JP-A-4142539, and JP-A-2002-141465.

SUMMARY OF THE INVENTION

In each power semiconductor module, the plurality of semiconductor elements are connected in parallel to each other. As a result, the larger the number of the semiconductor elements becomes, the more different the wiring distance from an external electrode to each semiconductor element becomes. This situation causes a difference to occur in the parasitic inductance. Moreover, this difference in the parasitic inductance and a variation in the characteristics of each semiconductor element cause a shift to occur in the timing of the switching. On account of this shift, a resonance is caused to occur between the respective semiconductor elements immediately before the current is switched off. Here, this resonance is caused to occur by the capacity of each semiconductor element and the parasitic inductance between the respective semiconductor elements. Furthermore, on account of this resonance, if each semiconductor element is, e.g., an IGBT (Insulated Gate Bipolar Transistor), a voltage oscillation is caused to occur between the collector and emitter at both ends of the IGBT, and further, between the gate and emitter as well. This voltage oscillation propagates all the way to the control circuit. At this time, the voltage oscillation caused to occur in each power semiconductor module gives rise to the generation of an electromagnetic wave in such a manner that an external closed circuit becomes the antenna therefor. Here, this external closed circuit is formed by the power conversion circuit and the ground or the housing via the parasitic capacity. This electromagnetic wave gives rise to the occurrence of electromagnetic failures and malfunctions of the inverter itself or the ones to the outside.

In recent years, there has been an increase in the demand for the high-voltage-use power semiconductor module which is used for a high-voltage-use high-efficiency power conversion apparatus. In this high-voltage-use power semiconductor module, the semiconductor elements are thick, and thus the semiconductor regions are long which are caused to exhibit withstand voltages. Accordingly, the depletion layers become widened, and a time is needed until the internal electric charges are ejected. Consequently, the resultant switching time is long. Also, the voltage in this power semiconductor module is high. Consequently, the energy stored into the parasitic capacity of each semiconductor element is also high. On account of this situation, in the large-current/high-voltage-use power semiconductor module where the large number of semiconductor elements are used, factors such as the shift in the timing of the switching cause a difference to occur in the energy stored into the parasitic capacity. On account of this difference, the LC resonance is caused to occur by the parasitic capacity C of each semiconductor element and the parasitic inductance L of the wirings which connect the respective semiconductor elements to each other. This LC resonance results in the occurrence of the large voltage oscillation.

Taking into consideration the problems as described above, the present invention has been devised. Accordingly, a purpose of the present invention is to provide a power semiconductor module that is capable of reducing the occurrence of the voltage oscillation which becomes the cause for phenomena such as electromagnetic failures.

In the power semiconductor module according to the present invention, the respective main electrodes of semiconductor switching elements such as IGBTs, which are respectively mounted on a plurality of insulating boards, are electrically connected to each other via a conductor member. Here, the conductor member is, e.g., a conduction wire or the like. This configuration makes it possible to suppress the occurrence of the resonant voltage due to the junction capacity and the parasitic inductance of each semiconductor switching element.

A power semiconductor module which is one aspect of the present invention includes a first insulating board, a second insulating board, a first semiconductor switching element mounted on the first insulating board, and including a first main electrode and a second main electrode, a second semiconductor switching element mounted on the second insulating board, and including a third main electrode and a fourth main electrode, a first main terminal electrically connected to the first main electrode, a second main terminal electrically connected to the second main electrode, a third main terminal electrically connected to the third main electrode, and a fourth main terminal electrically connected to the fourth main electrode, wherein the power semiconductor module includes at least a single conductor member for electrically connecting the first main electrode and the third main electrode to each other.

For example, the first and second semiconductor switching elements are IGBTs, and the first and third main electrodes are emitter electrodes of the IGBTs, and the second and fourth main electrodes are collector electrodes of the IGBTs. Also, for example, the first and third main terminals are emitter main terminals, and the second and fourth main terminals are collector main terminals.

According to the present aspect, it becomes possible to suppress the occurrence of the resonant voltage due to the junction capacity and the parasitic inductance of each of the first and second semiconductor switching elements.

Incidentally, the following configurations are also allowable in the above-described aspect: Namely, one end of the conductor member is connected to the first main electrode, the other end of the conductor member being connected to the third main electrode. Also, first and second wiring patterns are provided on the first and second insulating boards, respectively. Simultaneously, the first main electrode and the first wiring pattern may be electrically connected to each other via the conductor member, the third main electrode and the second wiring pattern being electrically connected to each other via the conductor member, and the first wiring pattern and the second wiring pattern being electrically connected to each other via the conductor member. Here, the first and second wiring patterns are, e.g., metallic films such as copper thin films which are bonded on the insulating boards.

Also, the following aspects are also allowable: Namely, a third wiring pattern is provided on the first insulating board, and is electrically connected to the second main electrode and the second main terminal simultaneously, a fourth wiring pattern is provided on the second insulating board, and is electrically connected to the fourth main electrode and the fourth main terminal. Moreover, the first wiring pattern and the second wiring pattern are electrically connected to each other via a conductor member. Here, the third and fourth wiring patterns are, e.g., the metallic films such as copper thin films which are bonded on the insulating boards.

According to these aspects as well, it also becomes possible to suppress the occurrence of the resonant voltage due to the junction capacity and the parasitic inductance of each of the first and second semiconductor switching elements.

According to the present invention, it becomes possible to reduce the voltage oscillation which is caused to occur at a switching-off time in the power semiconductor module.

Other objects, features and advantages of the invention will become apparent from the following description of the embodiments of the invention taken in conjunction with the accompanying drawings.

DETAILED DESCRIPTION OF THE EMBODIMENT

Figure 1:
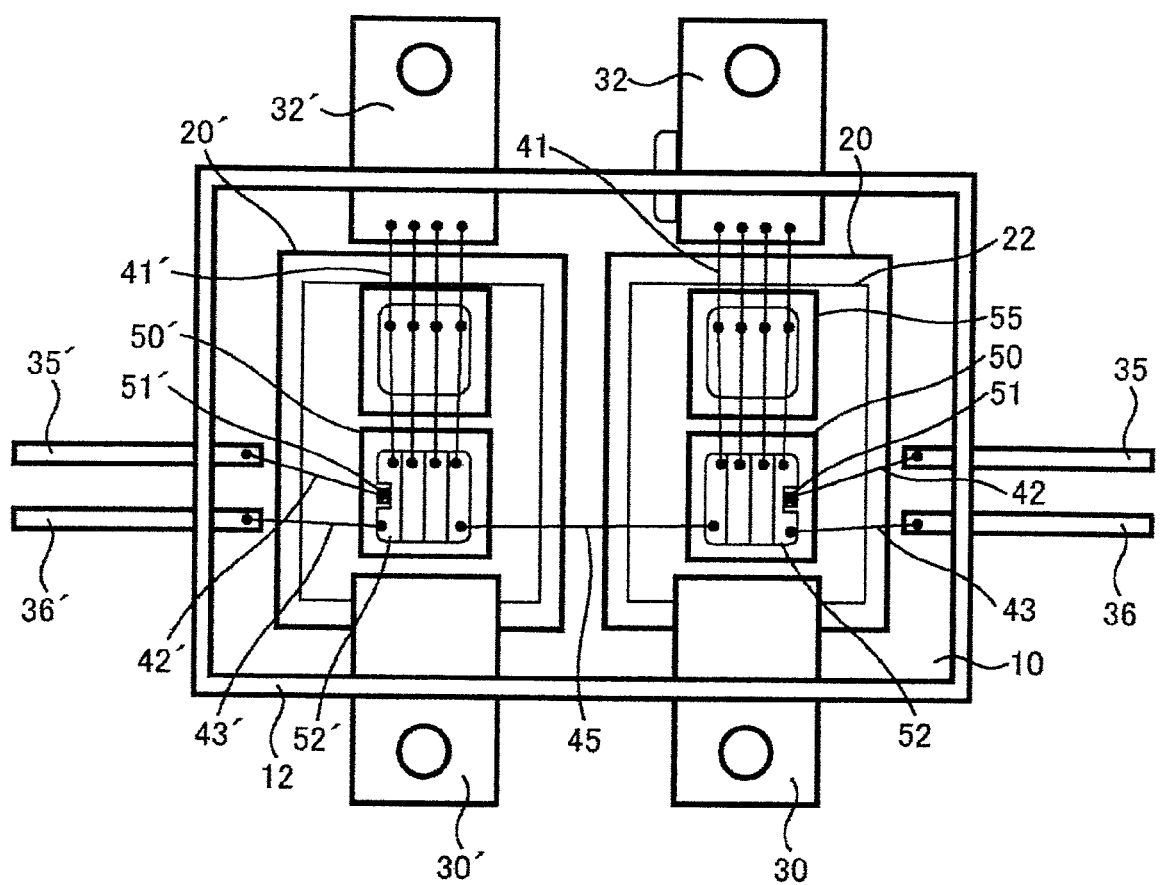
FIG. 1 illustrates a power semiconductor module which is a first embodiment of the present invention.

FIG. 1 illustrates the schematic internal structure of a power semiconductor module which is a first embodiment of the present invention. In the drawing, the same reference numerals denote the same configuration components.

Two insulating boards 20 and 20', on the upper portions of which a wiring pattern 22 is formed, are bonded on a heatsink-use metallic plate 10 by using a bonding material such as soldering. Incidentally, in the present embodiment, the configurations of surfaces of the insulating boards 20 and 20' and the configurations of their peripheries are basically the same configurations. Accordingly, in the following description, the contents described about one of the insulating boards are basically the same as the ones described about the other insulating board.

As semiconductor elements, an IGBT 50, i.e., a MOS-gate-type switching device, a free-wheeling-use diode 55, and a collector main terminal 30 are bonded on the wiring pattern 22 by using a bonding material such as soldering.

In the first embodiment in FIG. 1, the two insulating boards 20 and 20', on which the IGBTs and the diodes are similarly mounted, are stored into a resin case 12. Here, this storage is performed in such a manner that the deployments of the semiconductor elements, i.e., the IGBTs and the diodes, their electrodes, and the wiring patterns become linearly symmetric to each other. This symmetric configuration deploys the IGBTs 50 and 50' in a manner of being opposed to each other. Accordingly, between the two insulating boards 20 and 20', an emitter electrode 52 of the IGBT 50 and an emitter electrode 52' of the IGBT 50' are electrically connected to each other via a metallic wire 45 along a substantially shortest route, i.e., in accompaniment with a low inductance and a low resistance. Here, the wire 45 is connected to partial areas of the emitter electrodes 52 and 52'. Also, a large current such as the main current does not flow. Accordingly, the number of the wire 45 may be smaller than the number of wires 41 and 41' for electrically connecting emitter main terminals 32 and 32' and the emitter electrodes 52 and 52' to each other. Consequently, the number of the wire 45 is 1 in the present embodiment. Also, both ends of the wire 45 are connected to the emitter electrodes 52 and 52' with no intervention of some other electrode therebetween.

As will be described in detail later, the emitter electrodes 52 and 52' of the IGBTs 50 and 50', which are mounted on the different insulating boards 20 and 20' respectively, are electrically connected to each other via the conductor wire 45 inside the power semiconductor module. This configuration makes it possible to suppress the occurrence of the resonant voltage after the turn-off due to the junction capacity of the IGBTs 50 and 50' where the electric charges remain, and the parasitic inductance of the wirings on the periphery of the IGBTs 50 and 50'.

Incidentally, as the wire 45, a wire-like metallic conductor such as aluminum or copper wire can be used. Also, a narrowly long rod-like conductor such as copper bar may also be used.

The emitter electrode 52 of the IGBT 50 is connected to the emitter main terminal 32 via an aluminum wire 41 by way of the diode 55. A gate electrode 51 for performing the switching for the IGBT 50 is connected to a gate control terminal 35 via an aluminum wire 42. In order to provide a reference potential for applying a voltage to the gate electrode 51, the emitter electrode 52 is connected to an emitter control terminal 36 via an aluminum wire 43. The switching for the two IGBTs 50 and 50' is implemented as follows: Namely, an about 15-V voltage is applied to the gate control terminals 35 and 35' simultaneously. This voltage application switches on the two IGBTs 50 and 50', thereby establishing the electrical conduction between the collector main terminal 30 and the emitter main terminal 32, and allowing the main current to flow. In the present embodiment, as will be described later, the IGBTs 50 and 50' are electrically connected to each other via the aluminum wire 45. This configuration makes it possible to suppress the voltage oscillation at the switching-off time from propagating to the outside.

Figure 2:
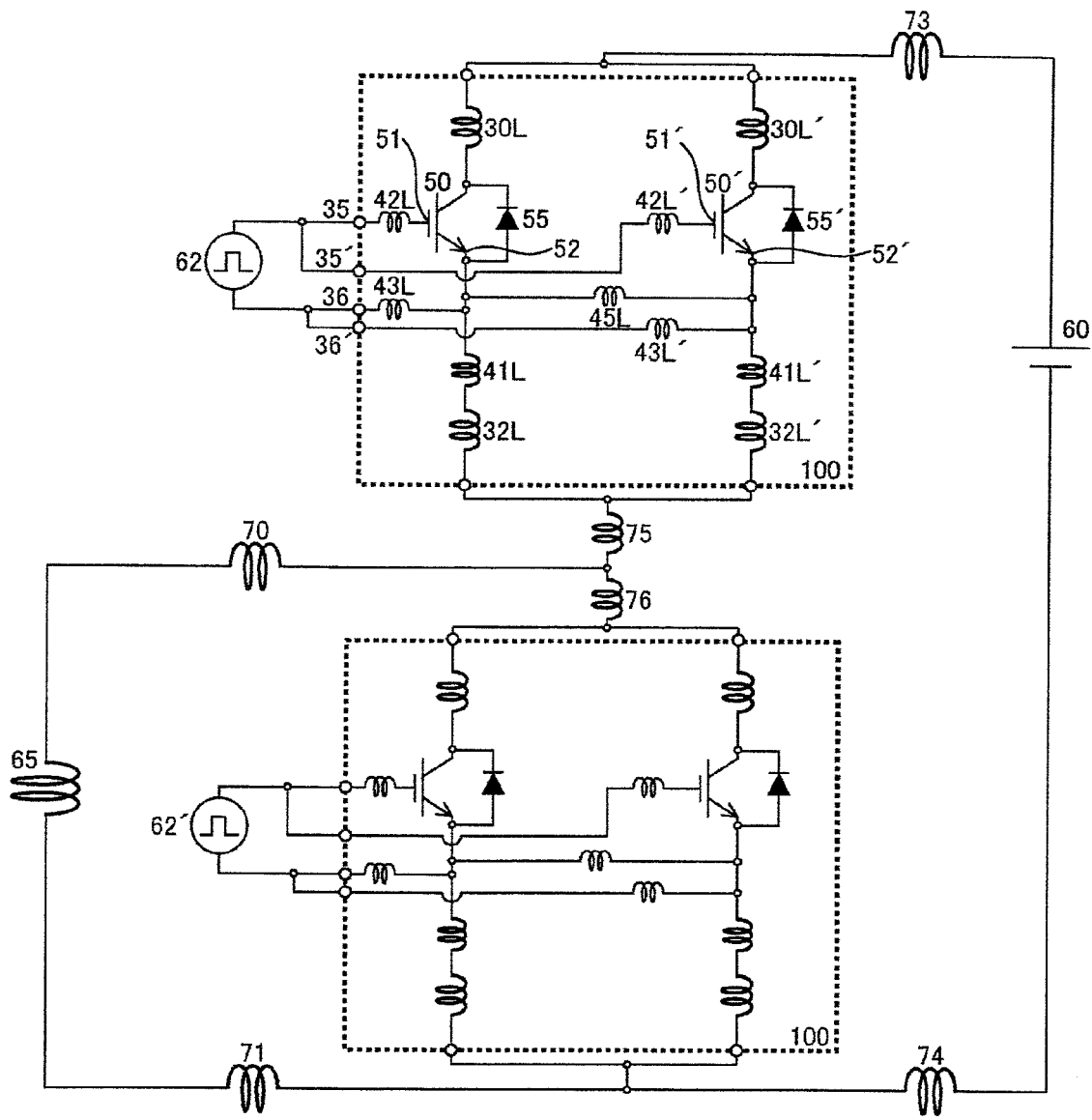
FIG. 2 illustrates the equivalent circuits of the first embodiment of the present invention.

FIG. 2 illustrates an inverter circuit, and a diagram of the equivalent circuits to the present embodiment. In the drawing, the portions surrounded by the dashed lines indicate the equivalent circuits to the power semiconductor modules in the present embodiment. The inverter circuit is a half-bridge circuit, which is configured as follows: Namely, the two power semiconductor modules in the present embodiment are connected in series to each other. Next, the connection intermediate-point portion is connected to a load inductance 65. Moreover, both ends of the in-series connected power semiconductor modules are connected to a power-source 60. For example, in a three-phase AC motor or the like, the load inductance 65 corresponds to a motor coil. Here, the three half-bridge circuits are connected in parallel to each other. Moreover, each of the connection intermediate-point portions is connected to each of the UVW phases of the motor's three-phase input. Although not illustrated, a low-parasitic-inductance capacitor is connected to the power-source 60 in parallel to each other. This is performed in order to instantaneously supply a current at a switching time. A driver circuit is connected to the gate control terminal 35 (35') and the emitter control terminal 36 (36') of each power semiconductor module. The driver circuit changes the on-time, thereby controlling a current to be flown of the load inductance 65.

In the present equivalent circuits, consideration is given to the LC resonance circuits. Accordingly, the equivalent circuits mainly indicate parasitic inductances. The parasitic inductances of connection cables between the load inductance 65 and each power semiconductor module 100, connection cables between each power semiconductor module 100 and the power-source 60, and connection cables between the respective power semiconductor modules 100 are denoted by 70 and 71, 73 and 74, and 75 and 76, respectively. Also, inside each power semiconductor module 100, the parasitic inductances of the collector main terminal 30 (30'), the emitter main terminal 32 (32'), and the aluminum wires 41 (41'), 42 (42'), and 43 (43') are denoted by 30L (30L'), 32L (32L'), and 41L (41L'), 42L (42L'), and 43L (43L'), respectively.

Here, selecting the half-bridge circuit as an example, consideration is given to a point-in-time when the IGBT 50 (50') of the power semiconductor module 100 in the upper arm of the half-bridge circuit is switched from on to off. While the IGBT 50 (50') is being switched on, an about 15-V voltage is being applied by a gate driver 62 between the gate control terminal 35 (35') and the emitter control terminal 36 (36') of the IGBT 50 (50'). This voltage application stores electric charges into the gate capacity (C) between the gate electrode 51 (51') and the emitter electrode 52 (52') of the IGBT 50 (50'). Also, the main current (I) is flowing through the IGBT 50 (50') and the parasitic inductances 30L, 41L, and 32L (30L', 41L', and 32L'). Energy of $(\frac{1}{2}) \times LI^2$ is stored into these parasitic inductances (L). At the off time, the gate driver 62 applies a 0V to (−15)V voltage between the gate electrode 51 (51') and the emitter electrode 52 (52') of the IGBT 50 (50'), thereby extracting the electric charges stored into the gate capacity (C). At this time, the electric charges displace, i.e., a current flows from the gate electrode 51 (51') to the gate driver 62 via the aluminum wire 42 (42') of the gate, and further, from the gate driver 62 to the emitter electrode 52 (52') via the control-use emitter wire 43 (43'). When the gate voltage between the gate electrode 51 (51') and the emitter electrode 52 (52') becomes lower than a gate threshold voltage, the main current (I) attenuates, and the electric charges stored into the IGBT 50 (50') are ejected via the collector electrode and the emitter electrode.

Figure 3:
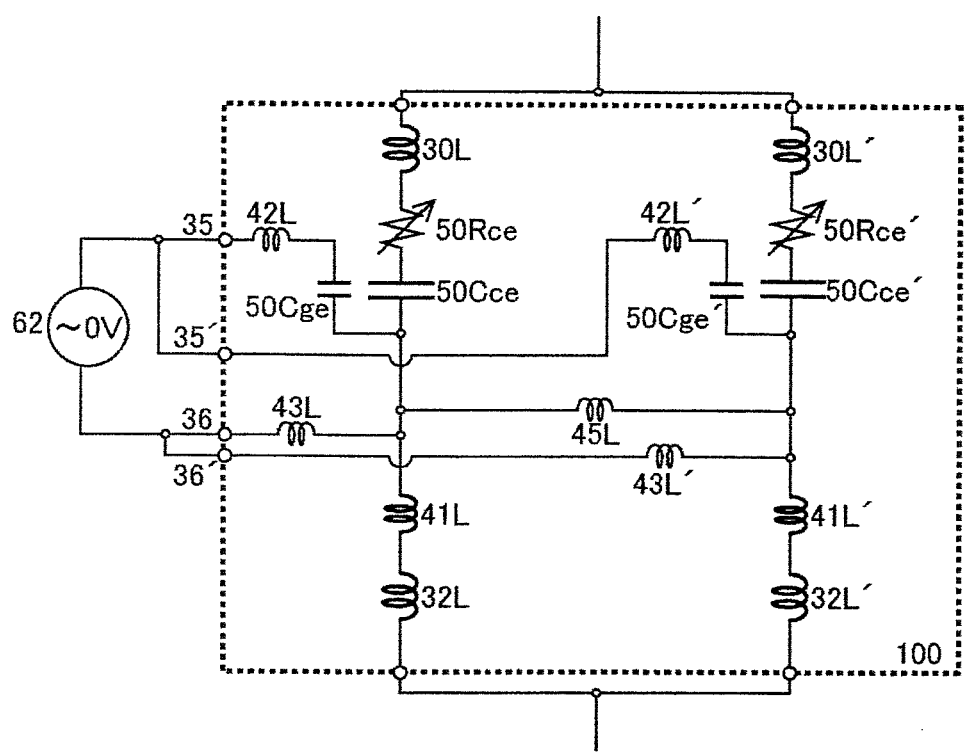
FIG. 3 illustrates the equivalent circuit of the first embodiment at a switching-off time.

FIG. 3 illustrates the equivalent circuit implemented at this off time. At this off time, the equivalent circuit described earlier changes from the low-resistance-equipped and electrical-conduction-established state to the following circuit: Namely, as illustrated in FIG. 3, electric charges stored into a capacity 50Cce between the collector electrode and the emitter electrode are released. In FIG. 3, the IGBT 50 is represented by the inter-collector/emitter capacity 50Cce, an inter-collector/emitter internal resistance 50Rce, and the inter-gate/emitter capacity 50Cge. While the electric charges stored into the inter-collector/emitter capacity 50Cce are being released, the main current (I) continues to flow. Also, the smaller the electric charges become in amount, the higher the internal resistance 50Rce becomes in value. During an initial time-period of the off time, the electric charges are rapidly released from the capacity 50Cce. This means that a rapid current change (di/dt) is caused to occur. This rapid current change, then, gives rise to the occurrence of a voltage (Ldi/dt) along the parasitic inductances (L) of the terminals and the aluminum wires. In the present embodiment configured with the two IGBTs, differences in these parasitic inductances and gate threshold voltages give rise to the occurrence of a difference in the voltages applied between the collector electrodes and the emitter electrodes of the two IGBTs. This difference in the voltages, further, results in the occurrence of a difference in the amounts of the electric charges stored into the two IGBT capacities 50Cce and 50Cce' which are mounted on the different boards. Subsequently, when the rapid current change during the initial time-period is finished, there occurs a tail-current time-period, during which a gentle current change continues for a long time.

In the present embodiment, the presence of the wire 45 makes it possible to equalize the difference in the amounts of the electric charges stored into the two IGBT capacities 50Cce and 50Cce'. On account of this equalization, the main current (I) is not permitted to flow into the wire 45. This situation prevents the energy $((\frac{1}{2}) \times LI^2)$ from being stored into the parasitic inductance (L), and also prevents the voltage (Ldi/dt) from being caused to occur along the parasitic inductance (L) by the rapid current change (di/dt) at the off time. Also, the gate current at the off time is not permitted to flow into the wire 45. This situation prevents a current along the present wire 45 from exerting its influence on the gate current. Also, the wiring length of the wire 45 is shorter than the wiring lengths of circuits closed by way of the control-use emitter wire 43 (43') and the emitter control terminal 36 (36'). This condition makes it possible to make the parasitic inductance smaller. This situation, further, prevents an electric-charges-difference-equalizing current from flowing into the gate driver 62 via the control-use emitter wire 43 (43'), thereby allowing the prevention of a malfunction of the gate-driver circuit. Namely, at the off time, the wiring length of the route of the LC circuit including the two IGBT capacities 50Cce and 50Cce' and the parasitic inductances 45L, 30L', and 30L is shorter than the wiring length of the route of the LC circuit including the two IGBT capacities 50Cce and 50Cce' and the parasitic inductances 41L, 32L, 32L', 41L', 30L', and 30L, or, the wiring length of the route of the LC circuit including the two IGBT capacities 50Cce and 50Cce' and the parasitic inductances 41L, 43L, 43L', 41L', 30L', and 30L. This condition makes it possible to prevent the LC-resonance current from flowing into the route of the gate circuit outside the wire 43 (43'). This state, further, prevents the occurrence of a potential oscillation of the emitter control terminal 36

(36'), which becomes a reference potential of the gate voltage. The prevention of this potential oscillation, eventually, makes it possible to prevent the voltage oscillation from propagating to the gate driver outside, thereby allowing the prevention of a malfunction such as a one that the IGBTs are switched on again.

Figure 9A:
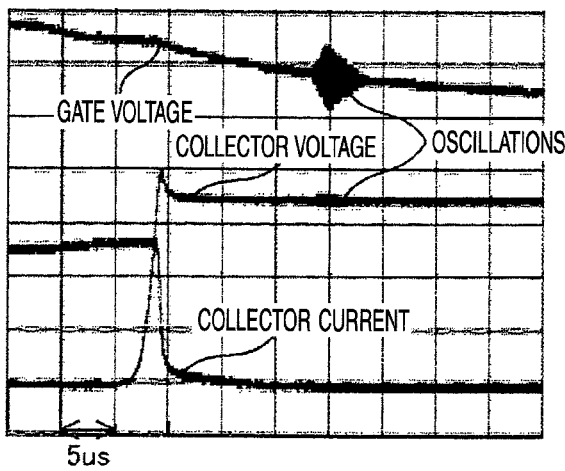
FIGS. 9A and 9B illustrate examples of the turn-off wave forms in the conventional power semiconductor module and the power semiconductor module to which the embodiment of the present invention is applied.
Figure 9B:
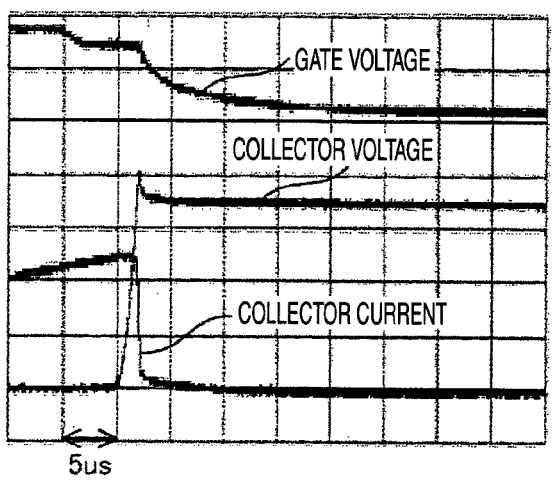

FIGS. 9A and 9B illustrate examples of the turn-off wave forms in the conventional power semiconductor module and the power semiconductor module to which the present embodiment is applied. FIGS. 9A and 9B indicate that, as compared with the conventional module, the present embodiment has successfully reduced the oscillations of the gate voltage and the collector voltage.

Figure 4:
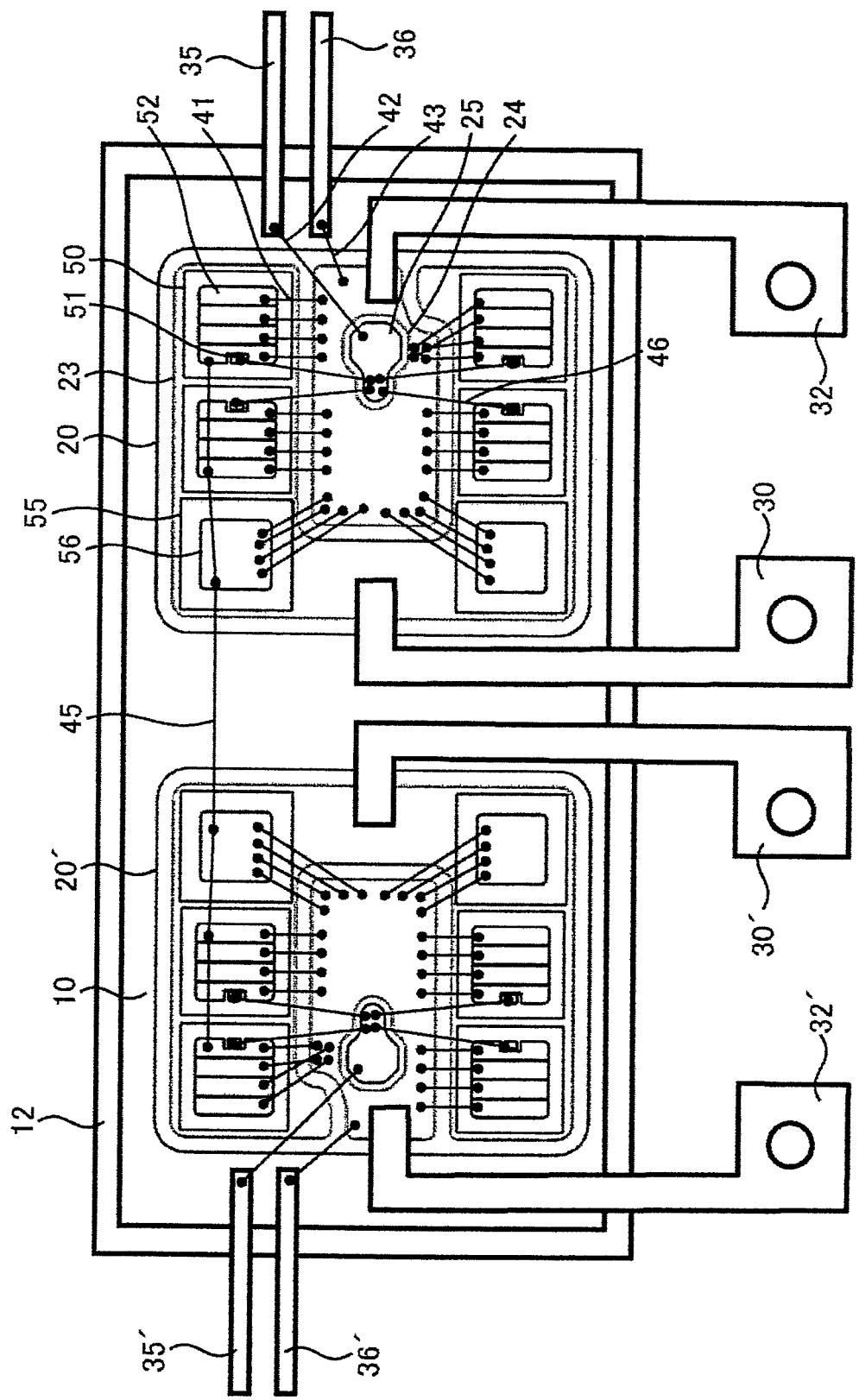
FIG. 4 illustrates a power semiconductor module which is a second embodiment of the present invention.

FIG. 4 illustrates the schematic internal structure of a power semiconductor module which is a second embodiment of the present invention.

The two units of insulating boards 20 and 20', on which a collector-use wiring pattern 23, an emitter-use wiring pattern 24, and a gate-use wiring pattern 25 are formed, are bonded on the heatsink-use metallic plate 10 by using a bonding material such as soldering.

The four units of IGBTs 50 and the two units of diodes 55 are bonded on the collector-use wiring pattern 23 by using a bonding material such as soldering. The emitter electrode 52 of each IGBT 50 and an anode electrode 56 of each diode 55, and the emitter-use wiring pattern 24 are connected to each other via the aluminum wire 41.

The collector main terminal 30 and the collector-use wiring pattern 23, and the emitter main terminal 32 and the emitter-use wiring pattern 24 are respectively connected to each other by using a bonding material such as soldering.

The gate electrode 51 of each IGBT 50 and the gate-use wiring pattern 25 are connected to each other via an aluminum wire 46. The gate control terminal 35 and the gate-use wiring pattern 25 are connected to each other via the aluminum wire 42. The emitter control terminal 36 and the emitter-use wiring pattern 24 are connected to each other via the aluminum wire 43.

The respective components mounted on the insulating board 20' are also connected to each other as is the case with the insulating board 20.

Also, the emitter electrodes 52 of the IGBTs 50 on the two units of insulating boards 20 and 20' are connected to each other via the aluminum wire 45. Here, the two units of IGBTs 50 and the one unit of diode 55 on the insulating board 20' are connected to each other via the aluminum wire 45 by way of the two units of IGBTs 50 and the one unit of diode 55 on the insulating board 20. Establishing the connection like this makes it possible to lower the height of the aluminum wire 45, thereby allowing implementation of a lowering in the parasitic inductance.

In the second embodiment illustrated in FIG. 4, the two units of insulating boards 20 and 20', on each of which the four units of IGBTs 50 and the two units of diodes 55 are similarly mounted, are stored into the resin case 12. Here, as is the case with the first embodiment, this storage is performed in such a manner that the deployments of the IGBTs and the diodes, their electrodes, and the wiring patterns become linearly symmetric to each other. Incidentally, on each of the insulating boards 20 and 20', the four units of IGBTs 50 and the two units of diodes 55 are respectively connected in parallel to each other via the wires and the wiring patterns. This configuration allows implementation of an increase in the current capacity of the power semiconductor module in comparison with the embodiment illustrated in FIG. 1.

In the present embodiment, the two units of IGBTs 50 and the one unit of diode 55 on the insulating board 20, and the two units of IGBTs 50 and the one unit of diode 55 on the insulating board 20' form a line along one side (i.e., the longer side in the present drawing) of the resin case 12. On the other side parallel to this side as well, the IGBTs and the diodes form a line similar thereto. On one of the lines of these semiconductor elements, as is the case with the first embodiment, some of the respective emitter electrodes of the four units of IGBTs 50 and the respective anode electrodes of the two units of diodes 55 are electrically connected to each other via the single wire 45 in such a manner that a bridge is constructed across them. Namely, the emitter electrodes of the IGBTs 50 and the anode electrodes of the diodes 55 mounted on the insulating boards 20 and 20' are electrically connected to each other via the wire 45 which extends across between the insulating boards 20 and 20'. As is the case with the embodiment illustrated in FIG. 1, this configuration makes it possible to suppress the occurrence of the resonant voltage due to the junction capacity of the IGBTs 50 and 50', and the parasitic inductance of the wirings on the periphery of the IGBTs 50 and 50'.

Incidentally, in the present embodiment, on the other semiconductor line as well, some of the emitter electrodes of the IGBTs 50 and the anode electrodes of the diodes 55 may be electrically connected to each other via a conductor wire similarly.

Figure 5:
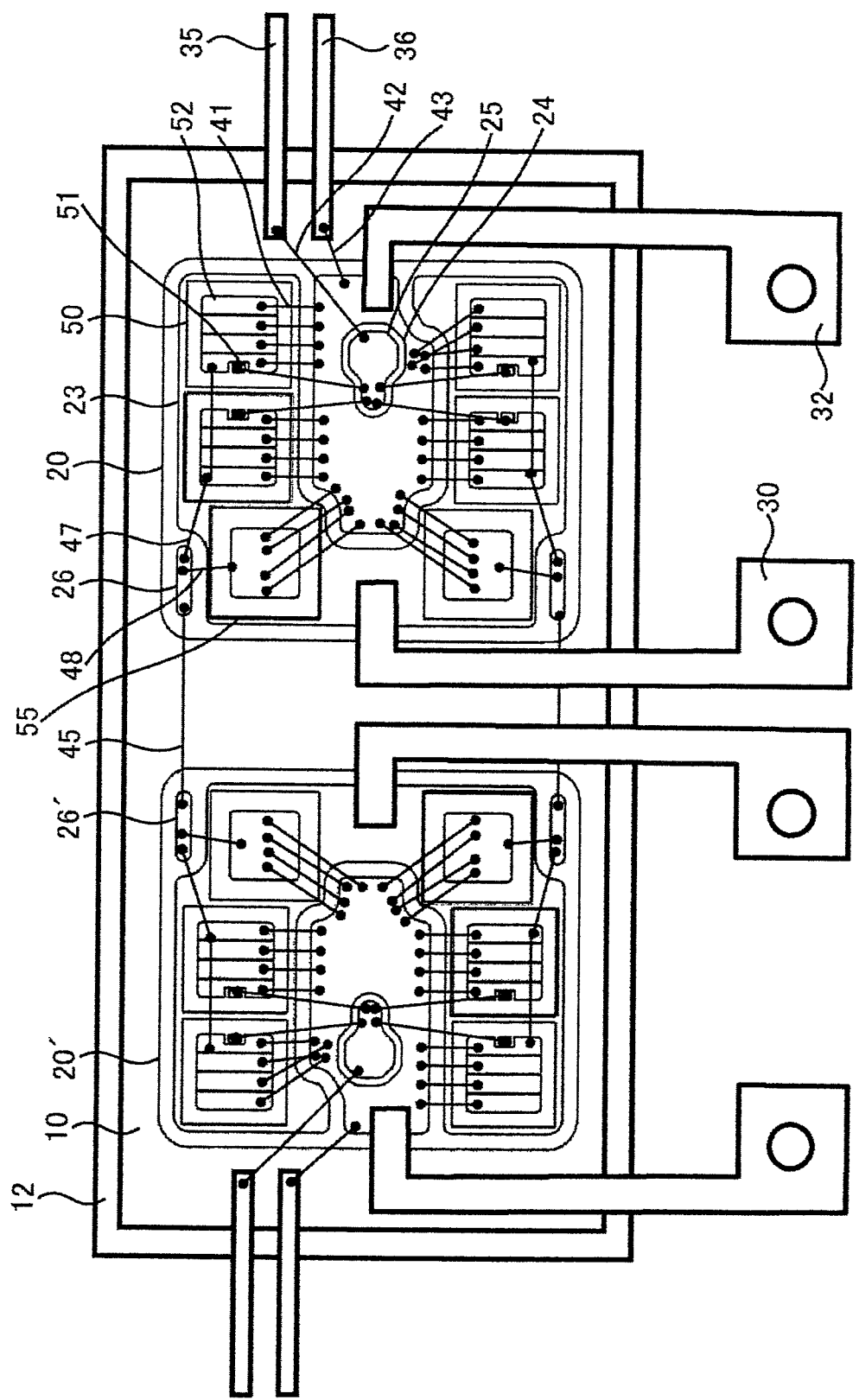
FIG. 5 illustrates a power semiconductor module which is a third embodiment of the present invention.

FIG. 5 illustrates the schematic internal structure of a power semiconductor module which is a third embodiment of the present invention.

The point at which the present embodiment differs from the second embodiment is as follows: Namely, the two units of insulating boards 20 and 20', on which the collector-use wiring pattern 23, the emitter-use wiring pattern 24, the gate-use wiring pattern 25, and an inter-insulating-boards connection 26 are provided, are used on the heatsink-use metallic plate 10. Here, the inter-insulating-boards connection 26 is specifically used for connecting, to each other, the emitter-electrode surfaces and the anode-electrode surfaces of the semiconductor elements mounted on the different insulating boards.

On each of these insulating boards 20 and 20', the emitter electrode 52 of each IGBT 50 and the inter-insulating-boards connection 26 are connected to each other via an aluminum wire 47. Simultaneously, the anode electrode 56 of each diode 55 and the inter-insulating-boards connection 26 are connected to each other via an aluminum wire 48. Moreover, the inter-insulating-boards connections 26 and 26' are connected to each other via the aluminum wire 45.

The use of these insulating boards 20 and 20' makes it possible to reduce failures caused to occur at the fabrication time. The insulating boards 20 and 20' are bonded on the heatsink-use metallic plate 10 by using a bonding material such as soldering. This bonding results in the occurrence of a slight amount of difference between the heights of the semiconductor elements mounted on the insulating board 20 and the insulating board 20'. On account of this situation, setting up the inter-insulating-boards-connecting aluminum wire 45 on the semiconductor elements results in the following possibility: Namely, the surface electrodes of the semiconductor elements are damaged at the wire-bonding time which is based on supersonic waves or the like. In contrast thereto, the use of the insulating boards 20 and 20' in the present embodiment makes it possible to prevent the damage of the surface electrodes of the semiconductor elements, thereby allowing implementation of an enhancement in the yield.

Figure 6:
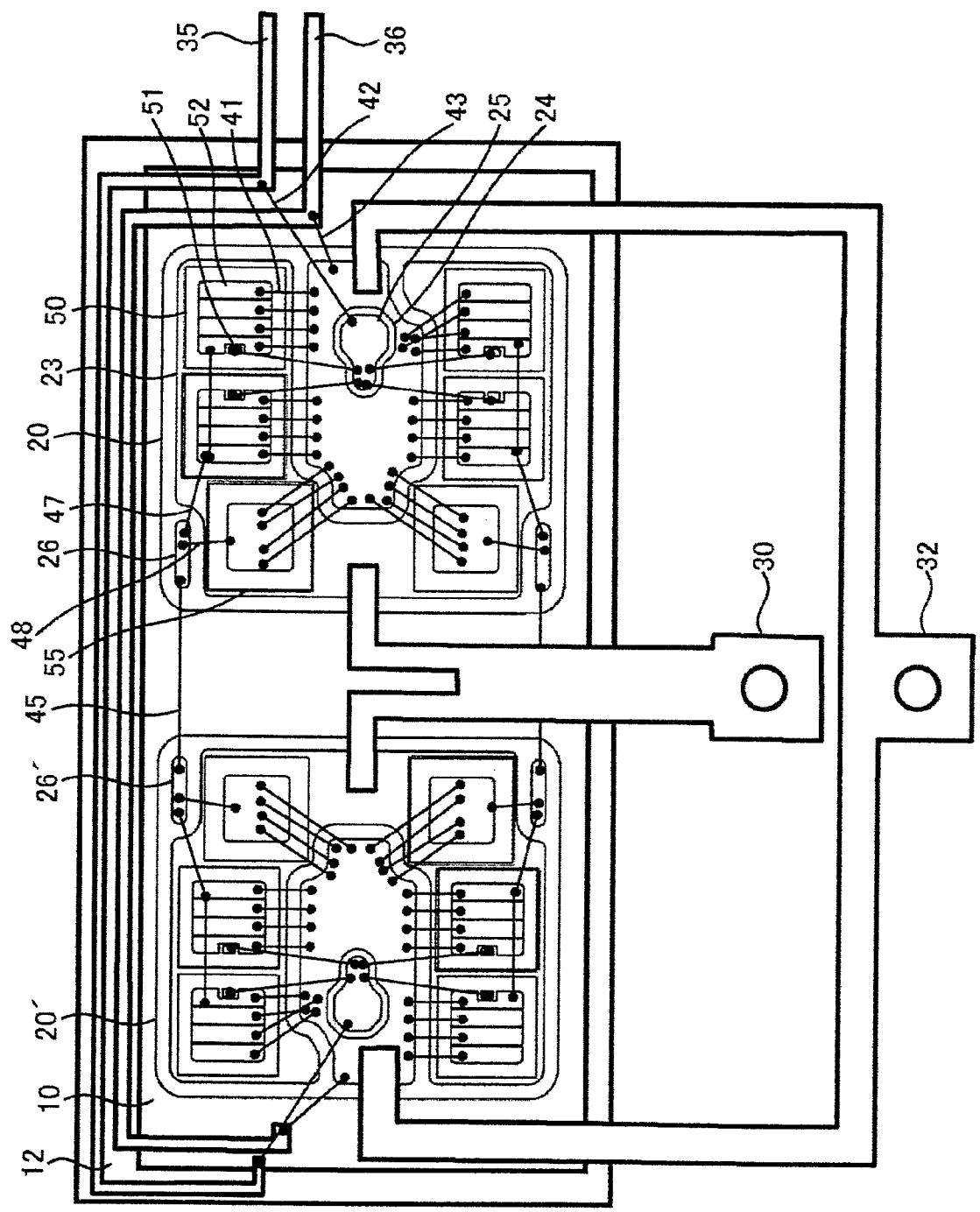
FIG. 6 illustrates a power semiconductor module which is a fourth embodiment of the present invention.

FIG. 6 illustrates the schematic internal structure of a power semiconductor module which is a fourth embodiment of the present invention.

The point at which the present embodiment differs from the third embodiment is as follows: Namely, the collector main terminal 30, the emitter main terminal 32, the gate control terminal 35, and the emitter control terminal 36 are made common to the two units of insulating boards 20 and 20'.

This commonality of these elements makes it possible to prevent the resonant current from flowing into the cables for connecting the terminals to each other, thereby allowing implementation of constant equalization of the (not-illustrated) connection-mode-based parasitic inductance of the resonant circuit.

Figure 7:
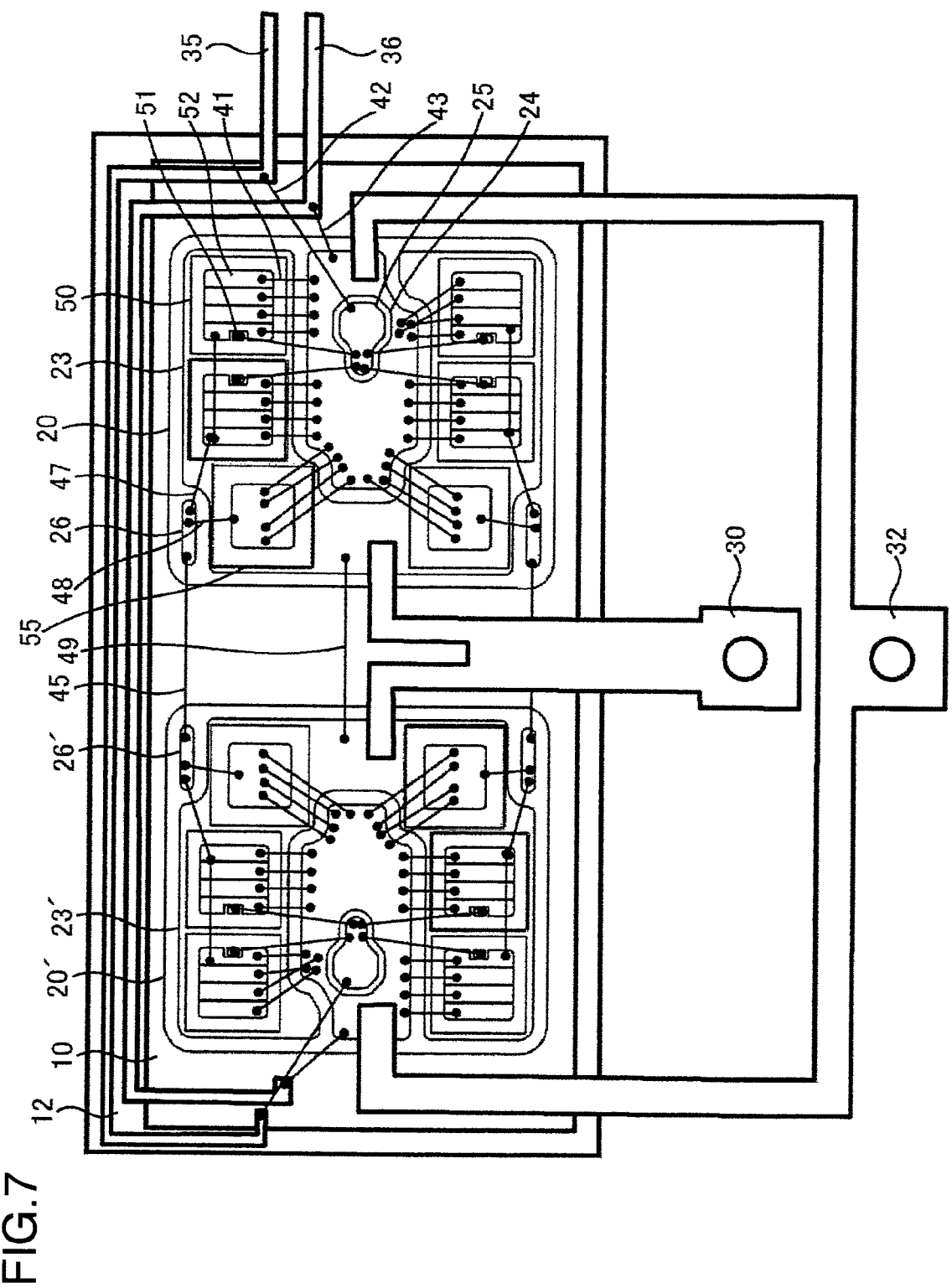
FIG. 7 illustrates a power semiconductor module which is a fifth embodiment of the present invention.

FIG. 7 illustrates the schematic internal structure of a power semiconductor module which is a fifth embodiment of the present invention.

The point at which the present embodiment differs from the fourth embodiment is as follows: Namely, the collector-use wiring pattern 23 mounted on the insulating board 20 and the collector-use wiring pattern 23' mounted on the insulating board 20' are connected to each other via an aluminum wire 49. This connection makes it possible to configure the following closed circuit: Namely, in this closed circuit, the collector electrodes and the emitter electrodes of the semiconductor elements mounted on the different insulating boards 20 and 20' are respectively connected to each other by way of none of an external terminal, and in accompaniment with the minimum parasitic inductance.

Figure 8:
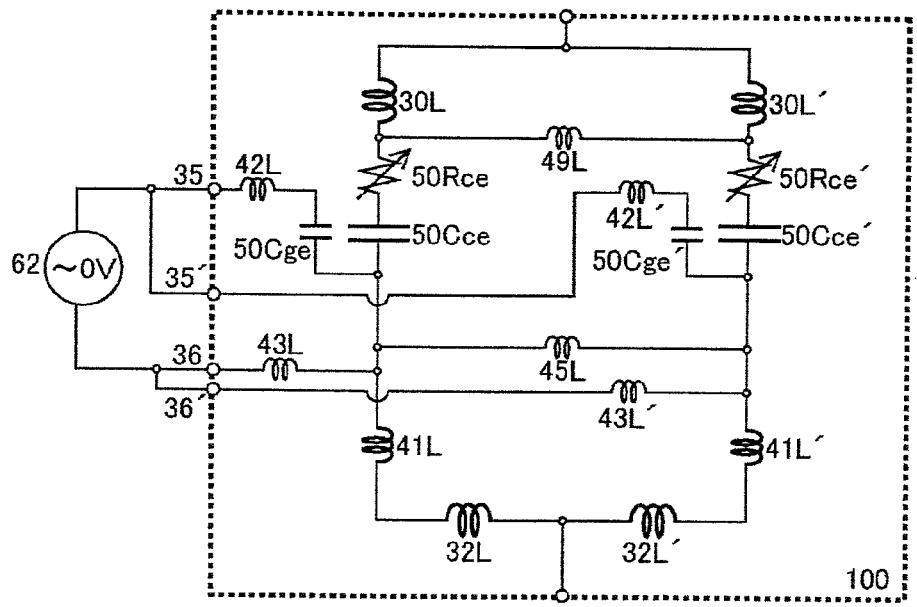
FIG. 8 illustrates the equivalent circuit of the fifth embodiment at a switching-off time.

FIG. 8 illustrates the equivalent circuit implemented at the off time in the fifth embodiment. Here, the capacities of the IGBTs and the diodes inside each of the insulating boards 20 and 20' are collectively represented by the capacity 50Cce, and the internal resistances of the two units of IGBTs are collectively represented by the capacity 50Rce, and the gate capacities are also collectively represented by the capacity 50Cge. As illustrated in FIG. 8, the following closed circuit is configured: Namely, in this closed circuit, the collector electrodes on the different insulating boards 20 and 20' are connected to each other via the inductance 49L of the wire 49, and the emitter electrodes thereon are connected to each other via the inductance 45L of the wire 45. These inductances are different from the respective terminals 30L, 30L', 32L, and 32L', and the wires 41L and 41L' through which the main current flows. Also, the parasitic inductance is lower than the parasitic inductances 43L and 43L' of the control-use emitter wire 43 (43'). This condition allows the occurrence of a smaller influence which is to be exerted on the gate driver.

According to the above-described respective embodiments, in the large-current/high-voltage-use power semiconductor modules where the large number of semiconductor elements are mounted on the large number of insulating boards, it becomes possible to provide the power semiconductor modules which successfully prevent the voltage oscillation from occurring over the outside at the switching-off time.

Furthermore, according to the present embodiment, it becomes possible to make the size of each insulating board smaller. Namely, the length of the diagonal line of each insulating board becomes shorter. By the way, at the connection portion between each insulating board and the heatsink-use metallic plate, and the connection portion between each insulating board and the conductor wire thereon, a stress is caused to occur by a difference in the linear expansion coefficient between the different-type materials at a temperature-varying time. The above-described feature, i.e., the shorter length of the diagonal line, however, makes it possible to make the above-described stress smaller, thereby allowing implementation of an extension in the connection life-expectancy. Also, the size of each insulating board becomes smaller. This feature makes it possible to carry out a cost down in the material expense and an intermediate check on each insulating-board basis, thereby allowing accomplishment of an enhancement in the yield of the completed products, and implementation of the cost down.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A power semiconductor module comprising:
a first insulating board;
a second insulating board;
a first semiconductor switching element mounted on said first insulating board and including a first main electrode and a second main electrode;
a second semiconductor switching element mounted on said second insulating board and including a third main electrode and a fourth main electrode;
a first main terminal electrically connected to said first main electrode;
a second main terminal electrically connected to said second main electrode;
a third main terminal electrically connected to said third main electrode; and
a fourth main terminal electrically connected to said fourth main electrode,
wherein said power semiconductor module comprises at least a single conductor member for electrically connecting partial areas of said first main electrode and said third main electrode to each other,
wherein said conductor member is separated from an input/output conductor member of the power semiconductor module through which a main current of the power semiconductor module flows so that the main current does not flow through the conductor member, and
wherein one end of said conductor member is connected to said first main electrode; and
the other end of said conductor member being connected to said third main electrode.

2. The power semiconductor module according to claim 1, further comprising:
a first wiring pattern provided on said first insulating board; and
a second wiring pattern provided on said second insulating board,
wherein said first main electrode and said first wiring pattern are electrically connected to each other via said conductor member,
wherein said third main electrode and said second wiring pattern are electrically connected to each other via said conductor member; and
wherein said first wiring pattern and said second wiring pattern are electrically connected to each other via said conductor member.

3. The power semiconductor module according to claim 1, wherein the first and second semiconductor switching elements comprise first and second IGBTs, wherein the first main electrode comprises an emitter electrode of the first IGBT and wherein the third main electrode comprises an emitter electrode of the second IGBT.

4. The power semiconductor module according to claim 2, wherein the first and second semiconductor switching elements comprise first and second IGBTs, wherein the first main electrode comprises an emitter electrode of the first IGBT and wherein the third main electrode comprises an emitter electrode of the second IGBT.

* * * * *